(12) United States Patent
Hatanaka et al.

(10) Patent No.: US 8,419,854 B2
(45) Date of Patent: Apr. 16, 2013

(54) FILM-FORMING APPARATUS (75) Inventors: Masanobu Hatanaka, Susono (JP);
Osamu Irino, Susono (JP); Michio Ishikawa, Susono (JP)

(73) Assignee: Ulvac, Inc., Chigasaki-shi (JP)

( * ) Notice: Subject to any disclaimer, the term of this patent is extended or adjusted under 35 U.S.C. 154(b) by 657 days.

(21) Appl. No.: 12/450,265

(22) PCT Filed: Apr. 15, 2008

(86) PCT No.: PCT/JP2008/057314
§ 371 (c)(1),
(2), (4) Date: Feb. 25, 2010

(87) PCT Pub. No.: WO2008/129977
PCT Pub. Date: Oct. 30, 2008

(65) Prior Publication Data
US 2010/0180819 A1 Jul. 22, 2010

(30) Foreign Application Priority Data

Apr. 17, 2007 (JP) ................... 2007-108027

(51) Int. Cl.
*C23C 16/455* (2006.01)
*C23C 16/511* (2006.01)
*C23F 1/00* (2006.01)
*H01L 21/306* (2006.01)
*C23C 16/06* (2006.01)
*C23C 16/22* (2006.01)

(52) U.S. Cl.
USPC ........... 118/715; 118/723 MW; 118/723 ME; 156/345.35; 156/345.36; 156/345.37; 156/345.41

(58) Field of Classification Search .................. 118/715, 118/723 MW, 723 ME; 156/345.35, 345.36, 156/345.37, 345.41
See application file for complete search history.

(56) References Cited

U.S. PATENT DOCUMENTS

| 4,977,855 A | * | 12/1990 | Ohmi et al. | .................... 118/722 |
| 5,792,272 A | * | 8/1998 | van Os et al. | .............. 118/723 R |

(Continued)

FOREIGN PATENT DOCUMENTS

| JP | B2-63-12377 | 3/1988 |
| JP | A-2003-41365 | 2/2003 |

(Continued)

OTHER PUBLICATIONS

International Search Report mailed on Jun. 3, 2008 in corresponding International Application No. PCT/JP2008/057314.

*Primary Examiner* — Rudy Zervigon
(74) *Attorney, Agent, or Firm* — Oliff & Berridge, PLC (57) ABSTRACT In a film-forming apparatus in which two or more gases are used, a uniform film is formed. In a film-forming apparatus provided with a film-forming chamber and a shower head, the shower head is provided with a material gas diffusion chamber and a reactive gas diffusion chamber. A gas passage which communicates the material gas diffusion chamber and a material gas introduction pipe is constituted into multi-stages of one stage or more. Each stage has a gas passage represented by $2^{n-1}$ (where n is the number of stages). The first-stage gas passage has connected to the center thereof the material gas introduction pipe. Each of second-stage and subsequent-stage gas passages has connected to the center thereof connection holes which are provided on both ends of the previous-stage gas passages so as to be in communication with the previous-stage gas passages. Each of the final-stage gas passages is connected to the material gas diffusion chamber by connection holes formed on both ends of each of the gas passages.

6 Claims, 10 Drawing Sheets

U.S. PATENT DOCUMENTS

| | | | | |
|---|---|---|---|---|
| 6,086,677 A * | 7/2000 | Umotoy et al. | | 118/715 |
| 6,372,084 B2 * | 4/2002 | Hongo et al. | | 156/345.1 |
| 6,402,849 B2 * | 6/2002 | Kwag et al. | | 118/715 |
| 7,452,827 B2 * | 11/2008 | Gianoulakis et al. | | 438/778 |
| 7,481,886 B2 * | 1/2009 | Kato et al. | | 118/715 |
| 7,520,245 B2 * | 4/2009 | Ohmi et al. | | 118/723 MW |
| 7,628,931 B2 * | 12/2009 | Saito et al. | | 216/58 |
| 7,806,078 B2 * | 10/2010 | Yoshida | | 118/723 I |
| 2001/0050059 A1 * | 12/2001 | Hongo et al. | | 118/723 MW |
| 2004/0099378 A1 * | 5/2004 | Kim et al. | | 156/345.33 |
| 2005/0000423 A1 * | 1/2005 | Kasai et al. | | 118/715 |
| 2005/0241767 A1 * | 11/2005 | Ferris et al. | | 156/345.35 |
| 2006/0112876 A1 * | 6/2006 | Choi et al. | | 118/715 |
| 2007/0022954 A1 * | 2/2007 | Iizuka et al. | | 118/724 |
| 2009/0038548 A1 * | 2/2009 | Iizuka et al. | | 118/724 |
| 2010/0119727 A1 * | 5/2010 | Takagi | | 427/532 |
| 2010/0180819 A1 * | 7/2010 | Hatanaka et al. | | 118/719 |
| 2010/0206229 A1 * | 8/2010 | He et al. | | 118/719 |
| 2011/0048325 A1 * | 3/2011 | Choi et al. | | 118/712 |

FOREIGN PATENT DOCUMENTS

| | | |
|---|---|---|
| JP | A-2003-332326 | 11/2003 |
| JP | A-2005-82849 | 3/2005 |
| JP | A-2005-129712 | 5/2005 |
| JP | A-2006-299294 | 11/2006 |

* cited by examiner

FILM-FORMING APPARATUS

TECHNICAL FIELD

The present invention relates to a film-forming (or a film-deposition) apparatus.

BACKGROUND ART

The chemical vapor deposition (CVD) method and the atomic layer deposition (ALD) method are methods in which a film is formed or deposited using two or more gases such as a material gas and a reactive gas (support gas) and the like. In a film-forming apparatus for carrying out the above methods, if the material gas and the reactive gas get mixed before they are introduced into the film-forming space, there will occur CVD reaction (film-forming reaction). In order to prevent the reaction from taking place, it must be so arranged that the material gas comes into contact with the other gases only when the material gas is introduced into the film-forming space through a shower head structure. As an apparatus to meet such conditions, there is known a film-forming apparatus in which a material gas diffusion chamber and a reactive gas diffusion chamber are independently disposed by separately defining into sections inside the shower head such that each gas is introduced into the film-forming space through the shower head structure without mixing gases (see, e.g., Patent Document 1).

Patent Document 1: JP-A-2005-129712 (FIG. 1, paragraphs 0017, etc.).

DISCLOSURE OF THE INVENTION

Problems to be Solved by the Invention

However, in the above-described film-forming apparatus, the reactive gas introduction port which is in communication with the second diffusion chamber for the reactive gas (supporting gas) and the material gas introduction port which is in communication with the first diffusion chamber for the material gas are disposed on a ceiling portion of the film-forming apparatus at a distance from each other and are in communication with each of the diffusion chambers inside the shower head main body. Therefore, the material gas will be introduced into the diffusion chamber for the material gas slightly off the center of the diffusion chamber for the material gas. As a result, after the material gas is introduced into the diffusion chamber through a nozzle from the diffusion chamber, the material gas cannot be supplied uniformly over the wafer. Therefore, there is a problem in that, if a film-forming is carried out by using this apparatus, a uniform film cannot be formed.

As a solution, it is a problem of this invention to solve the problem of the above-described prior art, i.e., to provide a film-forming apparatus for CVD or ALD which is capable of forming a uniform film by introducing the gases uniformly onto the substrate.

Means for Solving the Problems

A film-forming apparatus according to this invention comprises a film-forming chamber and a shower head unit. The shower head unit has: a material gas diffusion chamber; and a reactive gas diffusion chamber. A gas passage connecting the material gas diffusion chamber and a material gas introduction pipe together is constituted into multi-stages of more than one stage, each stage having a gas passage represented by $2^{n-1}$ (where n is a number of stages), a first-stage gas passage being connected to the material gas introduction pipe, each of second-stage and subsequent-stage gas passage or passages being in communication with the respective previous-stage gas passage, and each of the final-stage gas passages being connected to the material gas diffusion chamber.

In this case, preferably the first-stage gas passage has connected to a center thereof the material gas introduction pipe. Each of the second-stage and subsequent-stage gas passages has connected to a center thereof a connection hole provided at respective ends of the previous-stage gas passage, thereby communicating with the previous-stage gas passage. Each of the final-stage gas passage is connected to the material gas diffusion chamber by respective connection holes formed at respective ends of each of the gas passages. In addition, preferably, the material gas diffusion chamber is disposed at a bottom of the reaction gas diffusion chamber. The material gas introduction pipe is disposed on a wall surface of the reactive gas diffusion chamber, and each of the gas passages formed in each of the stages is formed in a circular arc-shape.

Preferably, the gas passages are formed in two stages. The first-stage gas passage has connected to the center thereof the material gas introduction pipe, each of the second-stage gas passages has connected to the center thereof connection holes provided in both ends of the first-stage gas passage, thereby communicating with the first-stage gas passage and, by means of connection holes formed on both ends of each of the gas passages, each of the second-stage gas passages is connected to four corners of square material gas diffusion chamber.

The film-forming apparatus according to this invention further comprises: a plasma generating means disposed on an upstream side of the shower head unit, the plasma generating means including: a coaxial resonant cavity provided with conducting bodies disposed at a distance from each other in an upper portion and a lower portion of an outer circumference of a non-metallic pipe for introducing the reactive gas; and a microwave supply circuit in which a height inside the coaxial resonant cavity is an integer time of ½ of an exciting wavelength, in which the gas injected from one end of the nonmetallic pipe is excited by microwaves in a region not provided with the nonmetallic pipe so as to be discharged, after conversion to plasma, out of the other end of the non-metallic pipe, and in which the gas converted to plasma by the plasma generating means is introduced into the reactive gas diffusion chamber. By having the above-described plasma generating means, it is possible to easily excite the reactive gas. In addition, the coaxial resonant cavity has a height which is an integer time of ½ of an exciting wavelength. Therefore, the oscillatory frequency does not vary before and after the plasma generation; it is possible to generate plasma simultaneously with the driving of the plasma generating means.

Preferably, the film-forming apparatus further comprises a cooling means disposed in the coaxial resonant cavity so as to introduce a cooling gas into the cavity, thereby cooling that portion of the nonmetallic pipe which is not provided with a conductor. In addition, a side wall of the nonmetallic pipe is double-walled, and the cooling fluid is circulated in the clearance between the double wall. By cooling as described above by providing the cooling means, it is possible to restrain the etching on the internal wall of the nonmetallic pipe, thereby improving the efficiency of generating the radicals.

Preferably, the film-forming apparatus further comprises a catalyst chamber in an upstream portion of the shower head unit. The catalyst chamber has a reactive gas introduction pipe, a metallic wire, and a heating means for heating the metallic wire and the catalyst chamber is so constructed and arranged that the gas introduced by the reactive gas introduction pipe is excited by the heated metallic wire and that the excited gas is introduced into the reactive gas diffusion chamber.

Effect of the Invention

According to the film-forming apparatus of this invention, since the gas can be uniformly introduced into the material gas diffusion chamber to thereby supply the inside of the vacuum chamber with the material gas uniformly, it has a superior effect in that a uniform film can be formed.

BEST MODES OF CARRYING OUT THE INVENTION

Figure 1:
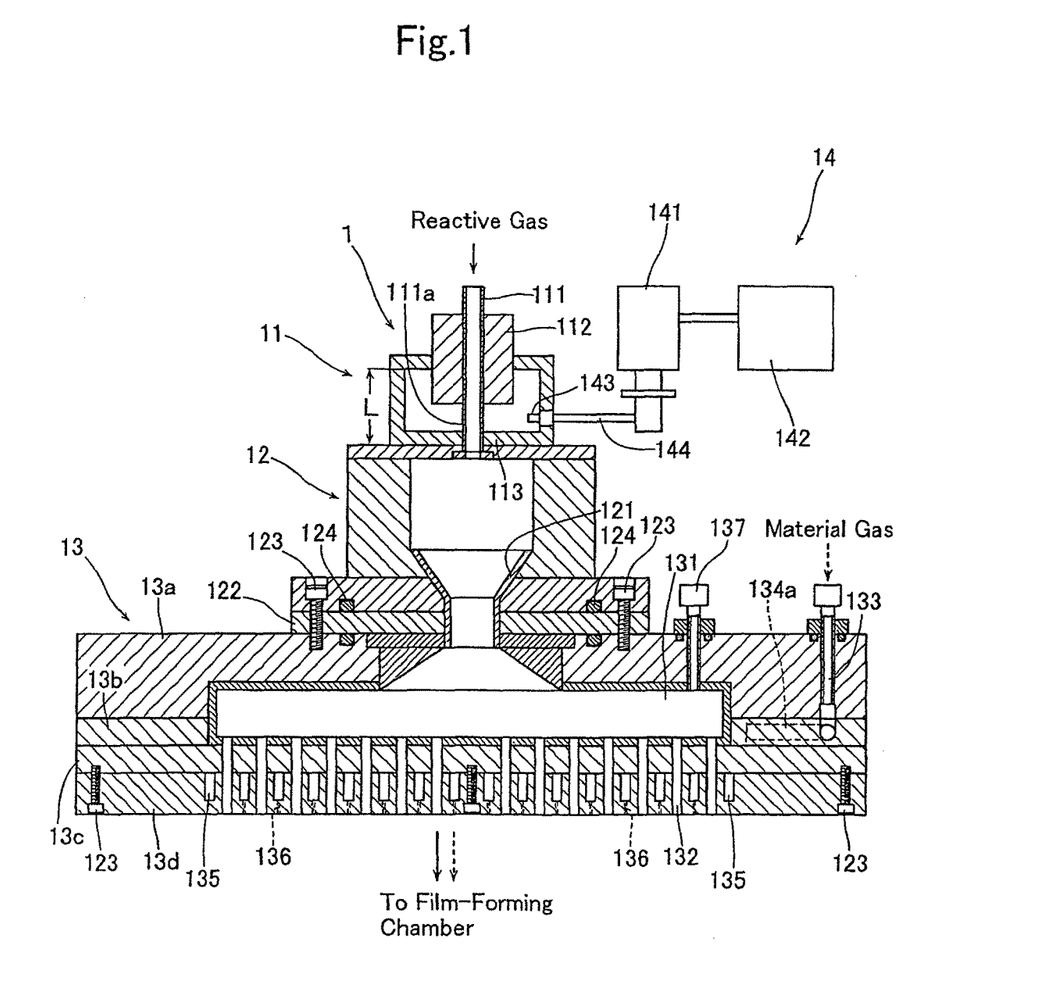
FIG. 1 is a schematic cross-sectional view explaining a shower head structure 1 of a film-forming apparatus to be used in carrying out this invention.

With reference to FIG. 1, a description will now be made of a first shower head structure 1 to be used in a film-forming apparatus according to the first embodiment of this invention.

The shower head structure 1 is made up of a coaxial resonant cavity 11 provided on an upper portion; a reactive gas introduction chamber 12 connected to the bottom portion of the coaxial resonant cavity 11; and a shower head unit 13 connected to the reactive gas introduction chamber 12.

The coaxial resonant cavity 11 is made, e.g., of copper or aluminum, and a nonmetallic pipe 111 is disposed by penetrating through the ceiling wall and bottom wall of the cavity. To an upper part of the nonmetallic pipe 111 there is connected a reactive gas source (not illustrated) through flow control means. As the nonmetallic pipe 111, a quartz pipe, a sapphire pipe, or an alumina pipe may be used. However, it is preferable to use a sapphire pipe or an alumina pipe for further reduction of particles.

On an upper part of this nonmetallic pipe 111, there is disposed a movable and coaxial upper conductor 112 in a manner to enclose the circumference of the pipe 111. Below this upper conductor 112, the bottom wall of the coaxial resonant cavity 11 functions as a lower conductor 113. The portion of the nonmetallic pipe 111 between these two conductors is exposed, and this exposed portion 111a is irradiated with a microwave. Although in FIG. 1 the bottom wall of the coaxial resonant cavity 11 is shown to serve as the lower conductor 113, it is to be understood that the lower conductor 113 may be provided as an independent member on the bottom portion of the coaxial resonant cavity 11.

To generate plasma in the region of the exposed portion 111a of the nonmetallic pipe 111, microwave supply means 14 is disposed on the sidewall of the coaxial resonant cavity 11 at a position corresponding to the exposed portion 111a. This microwave supply means 14 is made up of: a magnetron 141 for oscillating a microwave; a microwave power source 142 for actuating the magnetron 141; an antenna 143 connected to the magnetron 141 to supply the coaxial resonant cavity 11 with the microwave at a resonant frequency (e.g., 2.45 GHz) oscillated by the magnetron 141; and a coaxial cable 144 for connecting the antenna 143 and the magnetron 141 together. When the microwave power source 142 is actuated, the magnetron 141 generates a microwave, which passes through the coaxial cable 144 to the antenna 143 disposed on the wall surface. When the microwave is supplied into the coaxial resonant cavity 11 through the antenna 143, the reactive gas that has been introduced from the upper part of the nonmetallic pipe 111 is converted into a plasma state in a region of the exposed portion 111a and is supplied to the reactive gas introduction chamber 12 as a gas converted into plasma through the lower part of the nonmetallic pipe 111 which serves as a gas flow passage. As described, since this apparatus is not provided with a waveguide for propagating the microwave, once the microwave is oscillated, plasma can be generated quickly. Although a description was made with reference to FIG. 1 of an example in which only one antenna 143 was provided, it is to be understood that two or more antennas may be provided. Further, since the upper conductor 112 is movable as described above, its position may be changed to vary the state in which the electric field is generated between the upper conductor 112 and the lower conductor 113, whereby the state in which the plasma is generated can be changed.

Generally, the generation of plasma in a plasma generation space results in a change in the electric field distribution and hence in the resonant frequency of the space, consequently lowering the plasma generation efficiency. If the microwave supply means is adjusted in this case, a time lag will happen between the oscillation of the microwave and the generation of the plasma.

As a solution, the first film-forming apparatus is constructed such that the height L inside the coaxial resonant cavity 11 is equal to an integer multiple of one-half of the exciting wavelength to ensure that the resonant frequency does not change both prior to and subsequent to the generation of the plasma. In other words, in view of the fact that, while the electric field distribution in the coaxial resonant cavity 11 is TM mode prior to the generation of the plasma, it changes to the TEM mode subsequent to the generation of the plasma, the resonant frequencies of the coaxial resonant cavity 11 prior to and subsequent to the plasma generation were calculated based on an electrical equivalent circuit for each mode. Then, the height L was obtained so that both resonant frequencies become equal to each other. According to this arrangement, it is possible to restrict the change in the resonant frequency prior to and subsequent to the generation of the plasma.

Even if the inner height L of the coaxial resonant cavity 11 is set in this manner, there are still cases where the frequency in the cavity may change slightly prior to and subsequent to the generation of the plasma. It is therefore preferable to provide the microwave supply means 14 of the first shower head structure 1 with an exciting current control circuit. This control circuit monitors the frequency in the coaxial resonant cavity 11 prior to and subsequent to the generation of the plasma, and receives a signal corresponding to the change in the frequency. The current corresponding to this signal is supplied as an exciting current to the exciting coil (not illustrated) in the magnetron 141, thereby maintaining constant the wavelength of the microwave to be supplied.

Further, in case a reflected wave is generated inside the plasma generating chamber when a microwave is oscillated in a state in which the frequency inside the coaxial resonant cavity 11 has changed, then there may be provided an anode voltage control circuit that operates: to detect the reflected wave; and to charge, in a superposed manner to the anode electrode in the magnetron, the voltage corresponding to the phase difference between the reflected wave thus detected and the traveling wave of the oscillated microwave, so as to approach the resonant frequency. In this case, since the reflected wave is converted to heat in the microwave supply means, care must be taken so that the circuit is not damaged by the heat due to the reflected wave in case the anode voltage control circuit is provided. Further, the lower conductor 113 may be provided therein with a choke structure which corresponds to the length of one-quarter of the oscillated wavelength, thereby restricting the microwaves to be leaked from the exposed portion 111a.

As described, the first shower head structure is constructed such that the inner height L of the coaxial resonant cavity 11 is equal to an integer multiple of one-half of the exciting wavelength, whereby it is possible to oscillate a constant resonant frequency. In addition, it is so arranged that, by providing the exciting current control circuit and the anode voltage control circuit, even if the resonant frequency deviates prior to or subsequent to the generation of plasma, the frequency can automatically match. Further, in the first film-forming apparatus, there is generated no time lag between the oscillation of the microwave and the generation of the plasma. Therefore, it is possible to control the generation of plasma at an extremely short interval, e.g., from 0.5 seconds, thereby making the apparatus very suitable for the ALD method, in which the film-formation is performed by repeating the adsorption step and modification step in a multiplicity of times.

The reactive gas excited by the plasma within the nonmetallic pipe 111 of the coaxial resonant cavity 11 is introduced into the shower head unit 13 through the reactive gas introduction chamber 12. Preferably, the reactive gas introduction chamber 12 is made, e.g., of aluminum and preferably has a quartz inner lining on its inner walls to prevent generation of particles. In this case, the quartz inner lining preferably covers the entire inner walls of the gas introduction chamber 12, although it may cover only the lower regions of the inner walls (i.e., the side of the shower head unit 13), as shown in FIG. 1. Further, the surfaces of the inner walls of the reactive gas introduction chamber 12 may be anodized to prevent deactivation of gas radicals.

Further, the reactive gas introduction chamber 12 may be cooled by cooling means (not illustrated). A ceramic flange 122 (having a thickness of, e.g., 10 mm) is disposed between the reactive gas introduction chamber 12 and the shower head unit 13 and is fixed in place by fixing members 123 and 124. This ceramic flange 122 is provided to block the heat in the shower head unit 13, thereby preventing the reactive gas introduction chamber 12 from being heated up by the heat in the shower head unit 13. The ceramic flange 122 is preferably made of alumina ceramic in view of its good vacuum sealing properties, high thermal resistance, and good thermal blocking properties.

The shower head unit 13 is made up of a disc-like member 13a, a ring-like member 13b, a first shower plate 13c, and a second shower plate 13d, which are appropriately fixed in position by fixing members 123. The disc-like member 13a is preferably provided with a heater and a thermocouple (not illustrated). It is thus so arranged that the shower head unit 13 can be heated by the heater to a predetermined temperature (e.g., about 150° C.) and that the temperature of the heated shower head unit 13 can be measured and monitored by means of the thermocouple. Further, the disc-like member 13a has formed therein an opening which communicates with the reactive gas introduction chamber 12. This opening and an opening in the ring-like member 13b constitute a reactive gas diffusion chamber 131 into which the reactive gas is introduced and diffused. The reactive gas diffusion chamber 131 has a quartz inner lining covering its entire inner walls and also has a plurality of reactive gas ejection holes 132 formed in its bottom surface. These reactive gas ejection holes 132 penetrate through the first shower plate 13c and the second shower plate 13d to the bottom surface of the shower head unit 13.

Figures 2A, 2B, 2C:
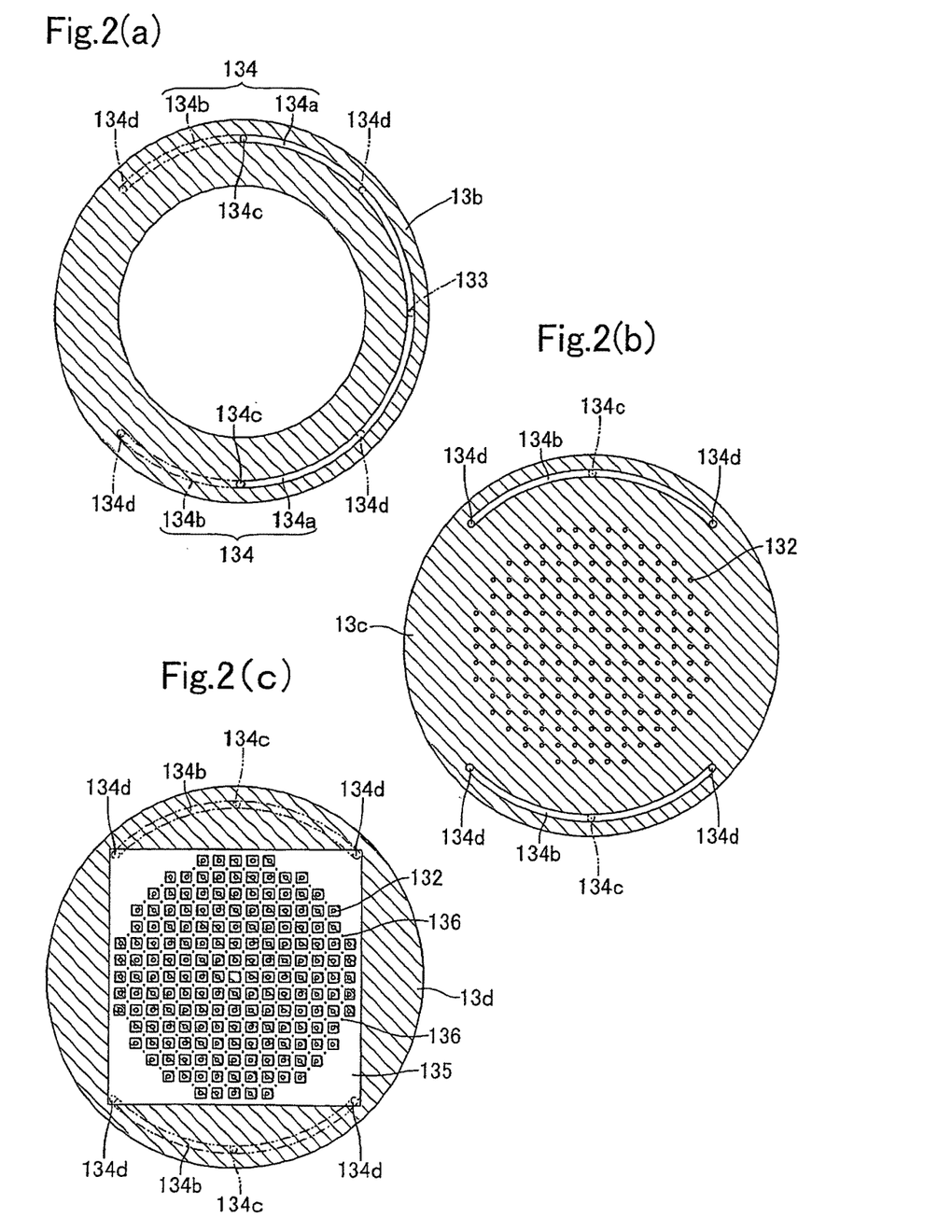
Figure 3:
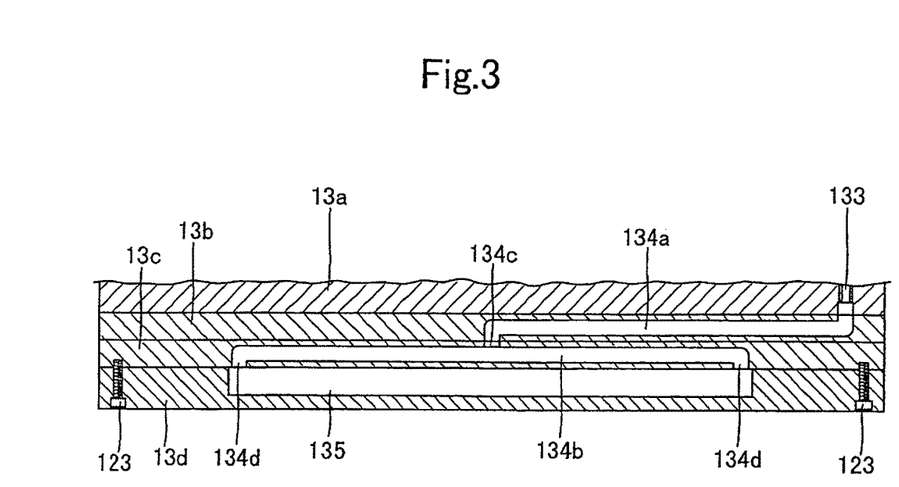
FIG. 3 is a schematic diagram illustrating the positional relationship among a material gas introduction pipe 133, a gas passage 134, and a material gas diffusion chamber 135.

Further, the disc-like member 13a has disposed therein a material gas introduction pipe 133 which is connected to a material gas introduction apparatus. This material gas introduction pipe 133 is connected to a material gas diffusion chamber 135 which is formed in the second shower plate 13d, the connection being made through a gas passage 134 which is made up of a gas passage 134a formed in the peripheral portion of the ring-like member 13b and gas passages 134b formed in the peripheral portion of the first shower plate 13c. This gas passage 134 is constituted in one or more successive multi-stages of paths, and each stage includes $2^{n-1}$ gas passages 134a or 134b (where n is the number of the stages). Preferably, the gas passage 134 is configured such that the distances from the junctions between the gas introduction pipe 133 and the first-stage gas passage 134a throughout to the junctions between the final-stage gas passages 134b and the material gas diffusion chamber 135 are all equal to one another. This gas passage 134 will be described in detail with reference to FIGS. 2 and 3. FIG. 2 is a horizontal cross-sectional view of (a) the ring-like member 13b, (b) the first shower plate 13c, and (c) the second shower plate 13d, respectively. FIG. 3 is a schematic diagram illustrating the positional relationship among the material gas introduction pipe 133, the gas passage 134, and the material gas diffusion chamber 135.

The gas passage 134 is made up of: the single circular arc gas passage 134a disposed in the ring-like member 13b; and the two circular arc gas passages 134b disposed around that region of the first shower plate 13c in which the reactive gas ejection holes 132 are formed. The material gas introduction pipe 133 is connected to the upper center portion of the gas passage 134a. Further, connection holes 134c are formed at the bottom portions of the respective ends of the gas passage 134a. Each connection hole 134c is connected to the upper center portion of the respective gas passages 134b disposed in the first shower plate 13c, so that the gas passage 134a communicates with the gas passages 134b.

Further, connection holes 134d are formed at the bottom portions of the respective ends of each gas passage 134b. These connection holes 134d are respectively connected to the four upper corners of the material gas diffusion chamber 135 in the second shower plate 13d, ensuring that the material gas is uniformly discharged into the material gas diffusion chamber 135 through the connection holes 134d.

In this manner, the gas passage 134 connected between the material gas diffusion chamber 135 and the material gas introduction pipe 133 constitutes two-stage passage. The first-stage gas passage 134a has connected to the center thereof the material gas introduction pipe 133. The second-stage gas passage 134b has respectively connected to the center thereof the connection holes 134c formed at the bottom portions of the respective ends of the gas passage 134a of the former stage, so that the gas passages 134b communicate with the gas passage 134a of the former stage. Further, by means of the connection holes 134d formed at the bottom portions of the respective ends of each gas passage 134b, the gas passage 134 is connected to the material gas diffusion chamber 135, thus forming a single gas flow path. This gas passage 134 is configured such that the distances from the material gas introduction pipe 133 to the respective connection holes 134d are equal to each other. Therefore, equal amounts of material gas reach the material gas diffusion chamber 135 at the same time so as to be uniformly diffused into the material gas diffusion chamber 135. Although in the figures the gas passage is described to be of two-stage constitution, so that four connection holes 134d are provided. It is to be understood, however, that the gas passage 134 may be constituted into three or more stages of paths and that connection holes 134d may be increased in number. For example, on the bottom portion of the first shower plate, there may be provided a third shower plate which has formed therein reactive gas ejection holes similar to those in the first shower plate and which also has four gas passages formed therein. With this arrangement, the connection holes in the first shower plate may be respectively connected to the upper center portions of the four gas passages in the third shower plate, and connection holes to be connected to the material gas diffusion chamber of the second shower plate may be formed at the respective end portions of each gas passage in the third shower plate. In other words, a total of eight connection holes are formed and the shape of the material gas diffusion chamber is designed accordingly so that the gas may be diffused more uniformly into the material gas diffusion chamber. Further, although in the figures the material gas diffusion chamber is shown to be rectangular, it may have another polygonal shape or a circular shape.

The material gas diffusion chamber 135 is provided with material gas ejection holes 136. These material gas ejection holes 136 are also penetrated through the bottom surface of the shower head unit 13. In this case, the conductance of the ejection holes shall preferably be made small to ensure that the material gas is uniformly ejected into the vacuum chamber. For example, in the apparatus shown in FIGS. 1 and 2, the material gas ejection holes 136 have a diameter $\Phi$ of about 0.7~1 mm and a depth of about 10 mm so as to uniformly supply the material gas into the vacuum chamber.

Since the reactive gas ejection holes 132 are penetrated through the bottom surface of the shower head unit 13, the reactive gas ejection holes 132 and the material gas ejection holes 136 are arranged at certain distance from each other in matrix in the bottom surface of the shower head unit 13. It is thus so arranged that the material gas and reactive gas are uniformly applied onto the substrate. The center distance between the material gas ejection holes 136 and the center distance between the reactive gas ejection holes 132 are set to be of the same distance (e.g., 14 mm). In this case, the reactive gas ejection holes 132 has a greater diameter than the material gas ejection holes 136; for example, the diameter of the material gas ejection holes 136 is 1 mm and that of the reactive gas ejection holes 132 is 5 mm. The reason for this is that the flow rate of the reactive gas is greater than that of the material gas in the modification process.

In the shower head unit 13 configured as described above, the reactive gas that has been introduced from the nonmetallic pipe 111 into the shower head unit 13 through the reactive gas introduction chamber 12 spreads over the entire volume of the reactive gas diffusion chamber 131 and is then supplied into the vacuum chamber through the reactive gas ejection holes 132. On the other hand, the material gas introduced from the material gas introduction pipe 133 is introduced into the gas passage 134a from the central portion of the gas passage 134a and is evenly divided into right and left of the gas passage 134a for further diffusion into each of the gas passages 134b formed in the lower stage, through the connection holes 134c. The material gas then passes equally into the right and left of the gas passages 134b and diffuses uniformly into the material gas diffusion chamber 135 from the connection holes 134d. The material gas is then discharged uniformly into the vacuum chamber through the material gas ejection holes 136 in the bottom surface of the material gas diffusion chamber 135.

A description will hereinafter be made of a second shower head structure which is used in a film-forming apparatus according to a second embodiment of this invention.

Figure 4:
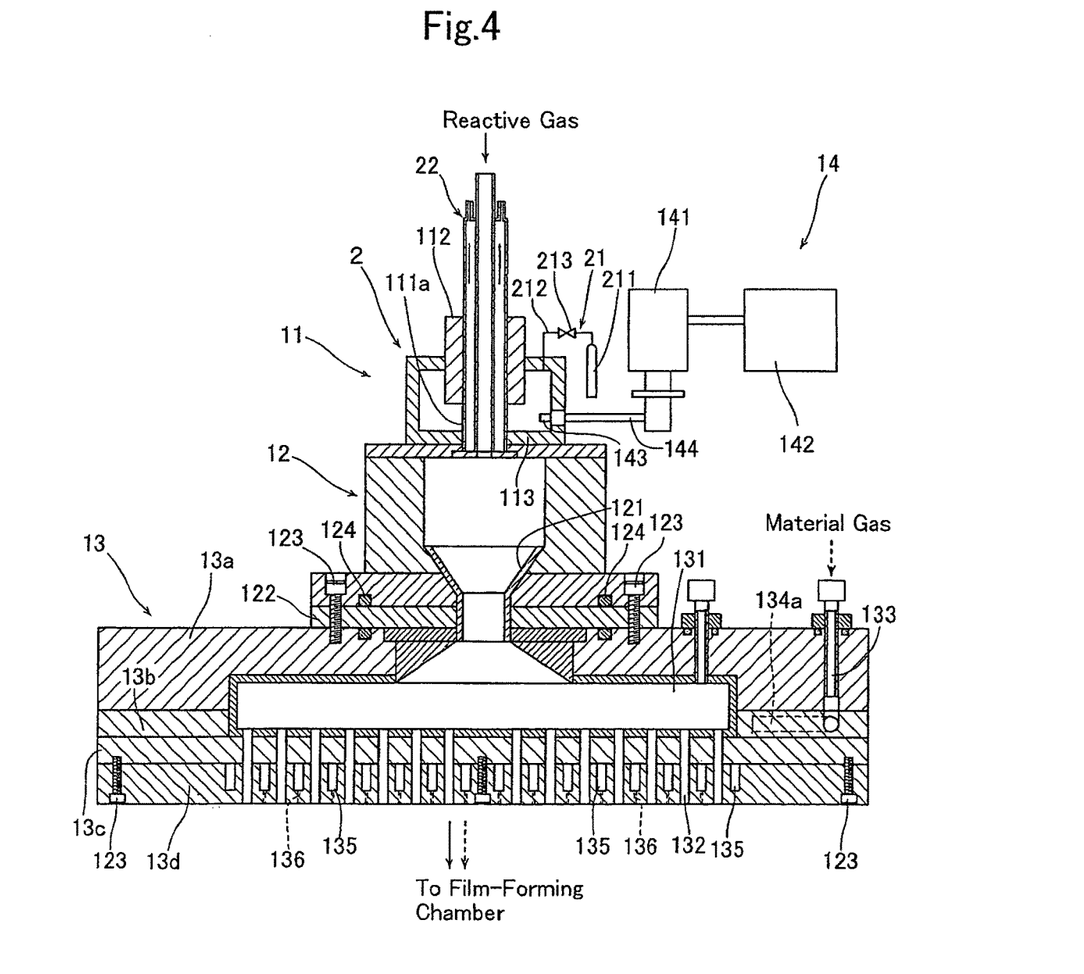
FIG. 4 is a schematic sectional view to explain a second shower head structure 2.
Figure 5:
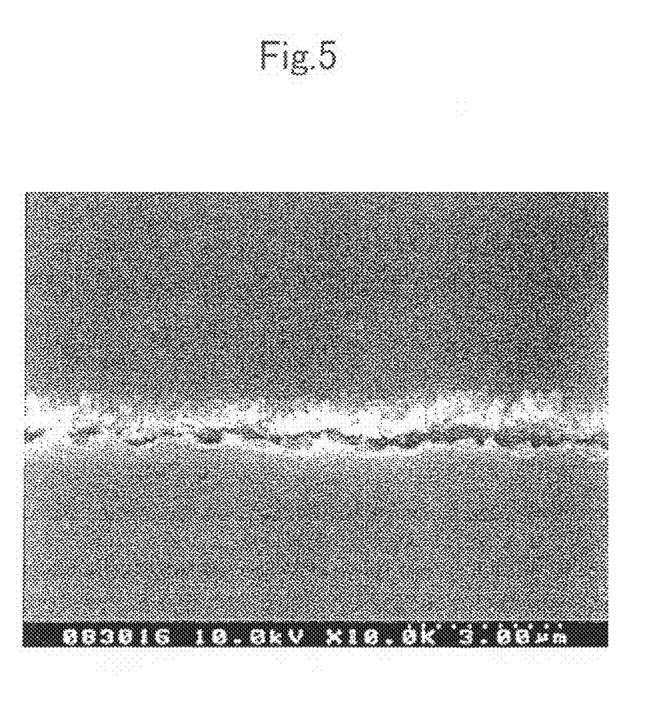
FIG. 5 is a SEM photograph showing the state in which an inner surface of a nonmetallic pipe is etched.

FIG. 4 is a schematic diagram of the second shower head structure 2. The same reference numerals are assigned to the same constituting elements as in FIG. 1. When film-forming work is carried out by processing extremely large amount of substrates by using a film-forming apparatus 1 provided with the first shower head structure 1 as shown in FIG. 1, there are cases where the inside of the nonmetallic pipe 111 is subjected to etching as shown in a SEM photograph of FIG. 5. Therefore, in order to restrict the etching, this second shower head structure 2 has at least one cooling means that the first shower head structure 1 does not have. In other words, the second shower head structure 2 is different from the first shower head structure in: that the second shower head structure 2 has a cooling gas introducing means 21 for cooling the coaxial resonant cavity; and that the nonmetallic pipe 111 has been changed to a nonmetallic (e.g., alumina, quartz) double pipe 22 which has formed therein a passage through which a cooling fluid can flow, and has at least one of the cooling means. A description will now be made of the changes.

The cooling gas introducing means 21 has a gas source 211, a gas pipe 212 connected to the gas source 211, and a valve 213 interposed in the gas pipe 212, and the cooling gas introducing means 21 is disposed in the coaxial resonant cavity 11. This cooling gas introducing means 21 enables to introduce the cooling gas into the coaxial resonant cavity 11 to thereby fill the inside thereof with the cooling gas. While exhausting the cooling gas by an exhaust means (not illustrated), the cooling gas is circulated. In this manner, it is possible to keep constant the temperature inside the coaxial resonant cavity 11 and to cool the exposed portion 111a of the double pipe 22.

As the cooling gas to be introduced from the gas source 211 into the coaxial resonant cavity 11, there may be used cooling gases that are free from influence on the human body and that can be discharged into the clean room, e.g., dry $N_2$ gas, dry Ar gas, dry He gas, dry $O_2$ gas, and the like.

Figure 6A:
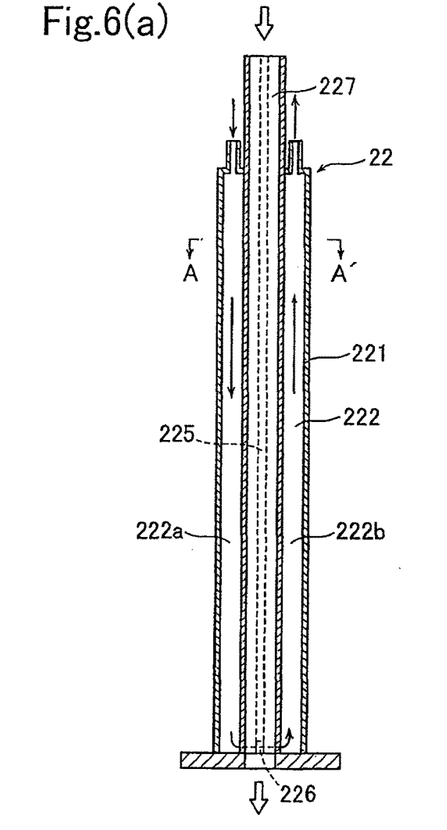
Figure 6B:
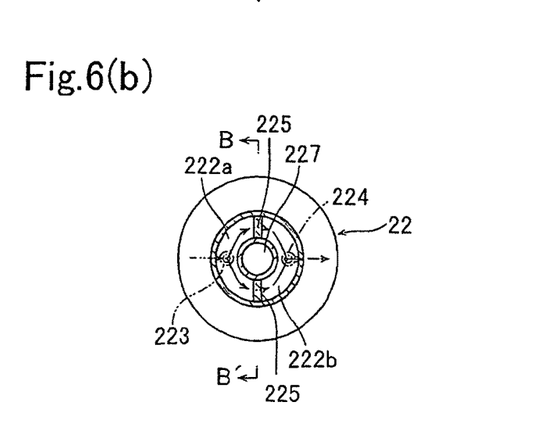
Figure 6C:
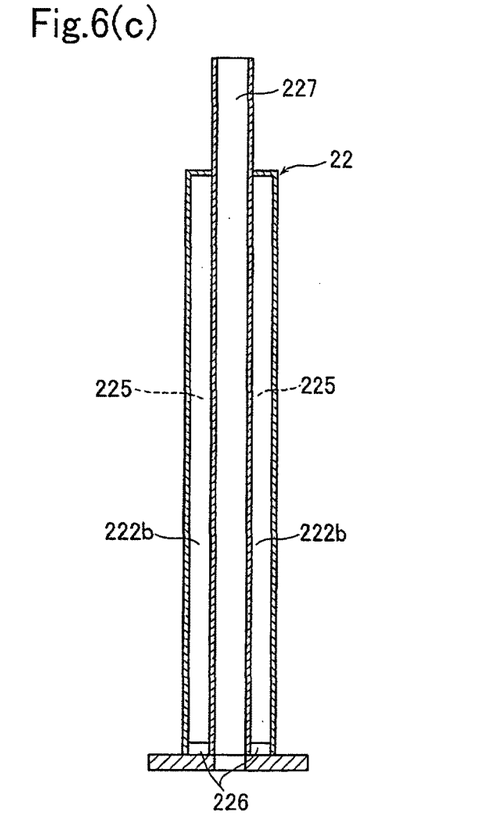

Next, a description will now be made of the double pipe 22 with reference to FIG. 6. FIG. 6(a) is a sectional vertical view of the double pipe 22, FIG. 6(b) is a sectional view taken along the line A-A' in FIG. 6(a), and FIG. 6(c) is a sectional view taken along the line B-B' in FIG. 6(b). As shown in FIG. 6(a), the double pipe 22 has a side wall made in double wall. Inside the side wall 221 there is formed a cooling fluid passage 222. On an upper wall of this cooling fluid passage 222 there are provided a fluid inlet 223 and a fluid outlet 224. As shown in FIG. 6(b), the cooling fluid passage 222 has inserted thereinto two partition plates 225. As shown in FIG. 6(c), in the lower portion of the partition plate 225 there are formed openings 226. According to this configuration, the upstream portion 222a on the fluid inlet 223 side of the cooling fluid passage 222 and the downstream portion 222b on the outlet 224 side are communicated with each other. The liquid flowing from the fluid inlet 223 flows from the top to the bottom through the upstream portion 222a of the cooling fluid passage 222, passes through the opening 226, and flows into the downstream portion 222b to thereby fill it from the bottom to the top, and flows through the fluid outlet 224 out of the side wall 221. In this manner, since the cooling fluid passage 222 covers substantially the entire outer circumference of the gas passage 227 inside the double pipe, the gas passage can be cooled from top to the bottom. It is to be noted that, in the figure, the fluid inlet 223 and the fluid outlet 224 are disposed on the upper surface of the double pipe 22, but that they may however be disposed on the side surface, respectively.

In this case, the cooling fluid must be a fluid medium that does not resonate at the oscillation frequency of the microwave. For example, when the oscillation frequency is 2.45 GHz, there may be used those available under the trade names Fluorinert FC-87, FC-72, FC-84, FC-77, FC-75, FC-3283, FC-40, FC-43, FC-70, and FC-5312 from 3M Corporation, and Galden® from Ausimont. There may also be used ethylene glycol or liquid medium containing substantially ethylene glycol. Further, there may also be used gases such as dry $N_2$ gas, dry Ar gas, dry He gas, dry $O_2$ gas, and the like.

In case the film formation is carried out by using the above-described second shower head structure 2, the cooling gas is kept introduced by the cooling gas introducing means 21, and/or the gas passage 227 is kept cooled by the double pipe 22, and film-formation is carried out. If film-formation is carried out while cooling in this manner, the etching on the inner surface of the gas passage 227 can be restrained, and the generation efficiency of the radicals can be increased. The reason why the inner surface of the gas passage 227 has not been etched is because the inner wall is sufficiently cooled.

As described above, by providing the cooling gas introducing means 21 and/or the double pipe 22, the etching on the inner surface of the gas passage 227 inside the double pipe 22 can be restrained and the radicals in the plasma formed in the region of the exposed portion 111a can be prevented from being deactivated. As a result, the generation efficiency of the radicals can be increased, whereby the film-formation can be efficiently carried out.

Figure 7:
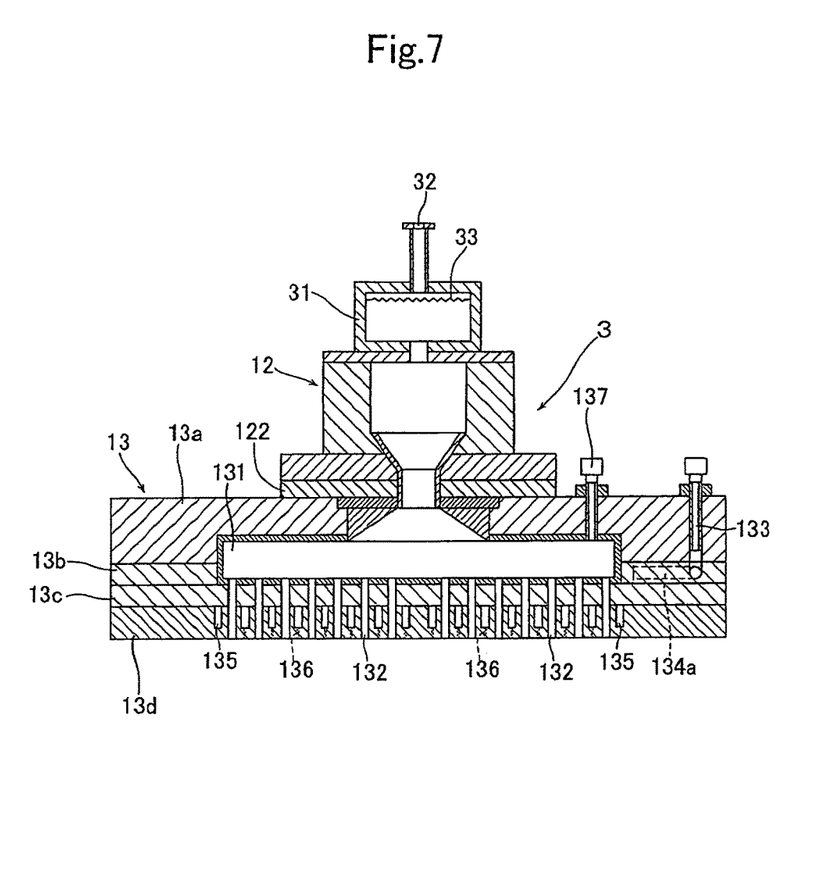
FIG. 7 is a schematic cross-sectional view explaining a third shower head structure 3.

With reference to FIG. 7, a description will now be made of a third shower head structure to be used in a film-forming apparatus relating to a third embodiment of this invention. In the figure, the same reference numerals are used with the constituting elements that are the same as those in FIG. 1. The third shower head structure 3 of this invention is different from the one in the first film-forming apparatus in that, unlike the first film-forming apparatus, there is disposed a catalyst chamber 31 provided with catalyst excitation in order to excite the reactive gas without using the coaxial resonant cavity 11 and the microwave generating means 14.

On an upper part of the catalyst chamber 31 there is disposed a reactive gas introduction pipe 32 and, on a downstream side of this reactive gas introduction pipe 32, is disposed a wire 33. The wire 33 is made of a known catalyst metal such as tungsten, and the like, and is so constructed as to be heated to a desired temperature. On a side wall of the catalyst chamber 31 there is provided a temperature control system (not illustrated), whereby the catalyst chamber 31 can be maintained at a desired temperature. On the downstream side of the catalyst chamber 31, there is a reactive gas introduction chamber 12, both chambers being in communication with each other.

The reactive gas introduced from the reactive gas introduction pipe 32 with the flow rate being controlled is energized by the wire 33 when introduced into the catalyst chamber 31 so as to become radicals and is introduced into the reactive gas introduction chamber 12. In case the wire 33 has not been heated to a predetermined temperature, the gas is hard to be energized and does not become radicals.

By the way, some material gases will give rise to thermal decomposition at above a predetermined temperature. It is therefore necessary to gasify them at a temperature below a predetermined temperature before introducing them. In such cases, the material gas introduction apparatus used in the first through third shower head structures 1~3 shall preferably be constituted as shown in FIGS. 8 and 9. A description will now be made with reference to FIGS. 8 and 9.

Figure 8A:
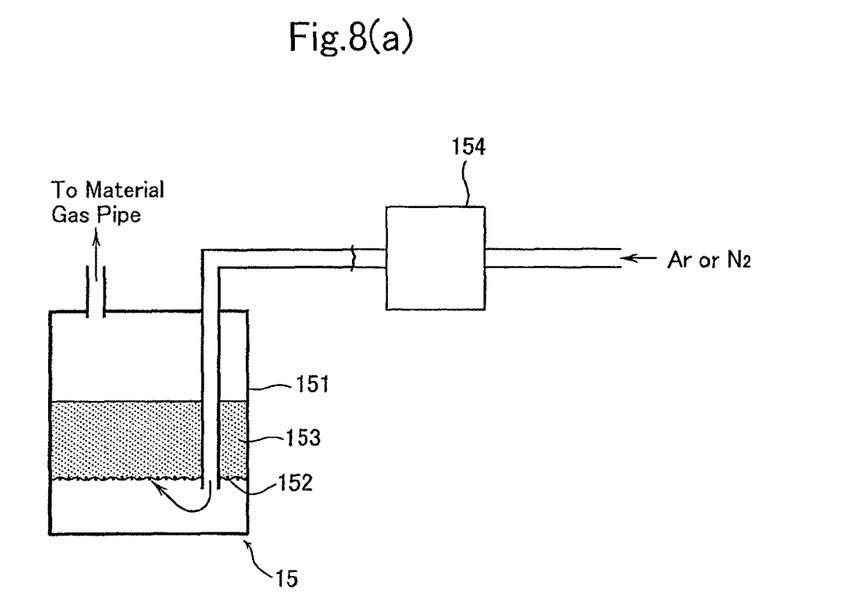
Figure 8B:
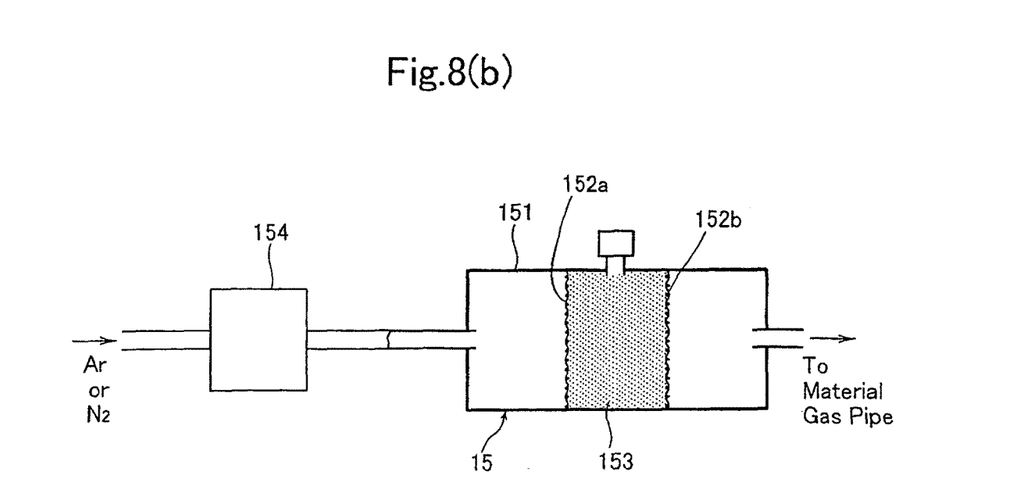
Figure 9:
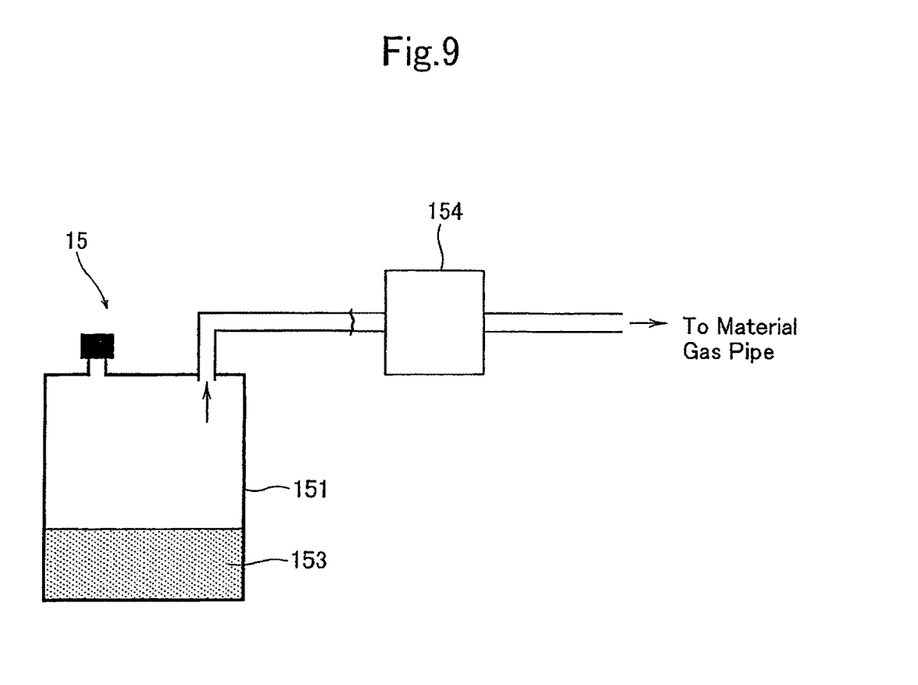
FIG. 9 is a schematic arrangement drawing explaining still another example of material gas generation.

FIGS. 8(a) and (b) are schematic views showing the construction of the material gas introduction apparatus 15. In case Zr(BH4)4 is used as a material, it is preferable to keep this material at $-10°$ C.~$25°$ C. which are the temperatures lower than the melting point ($28.7°$ C.), particularly, it is preferable to keep it to $-5°$ C.~$5°$ C. Since Zr(BH4)4 is very poor in thermal stability, if it is above $25°$ C., it will be decomposed into $ZrB_2$, $B_2H_6$ and the like through autolysis in a material tank. If the temperature is below $-10°$ C., on the other hand, the vapor pressure becomes lower than 2 mmHg, which is too low to be used as the material for the ALD. A screen 152 with a small mesh size is disposed in a tank 151 maintained at, e.g., $0°$ C. (vapor pressure 3.7 mmHg), and a granulated material 153 is put in position on the screen. An inert gas such as Ar, He and the like as a bubbling gas is supplied to the lower part of the tank 151 through a mass flow controller 154, and the inert gas is caused to flow through the material 153 from below the screen 152 upward. The material 153 is caused to be sublimed through this bubbling and is introduced into the material gas diffusion chamber 135 through the material gas introduction pipe 133 and the gas passage 134 (FIG. 8(a)). Or else, between two screens 152a and 152b disposed inside the tank 151 that is held at about, e.g., $0°$ C., granulated material 153 is held therebetween. An inert gas such as Ar, He and the like as a bubbling gas is caused to flow inside the material through the mass flow controller 154 from the screen 152a to the screen 152b inside the tank 151 to thereby sublime the material 153 through the bubbling. The material gas is introduced, together with the bubbling gas, into the material gas diffusion chamber 135 through the material gas introduction pipe 133 and the gas passage 134 (FIG. 8(b)).

The material gas may also be introduced in the following manner by using a material gas introduction apparatus 4 as shown in FIG. 9. In other words, a material is introduced into a tank 151 which is maintained at, e.g., about $0°$ C. (vapor pressure 3.7 mmHg), and the material is introduced into the material gas diffusion chamber 135 through the material gas introduction pipe 133 and the gas passage 134 while directly controlling the flow rate of the vaporized gas of the material 153 by using a mass flow controller 154 such as a low differential pressure mass flow controller. In this case, when the material gas is introduced into the chamber, the pressure in the chamber must surely be made lower than the vapor pressure of the material gas. For example, when the material tank is cooled and insulated at $0°$ C., the vapor pressure of the material gas is 3.7 mm Hg. Therefore, the chamber pressure must be made lower than 3.7 mm Hg.

Figure 10:
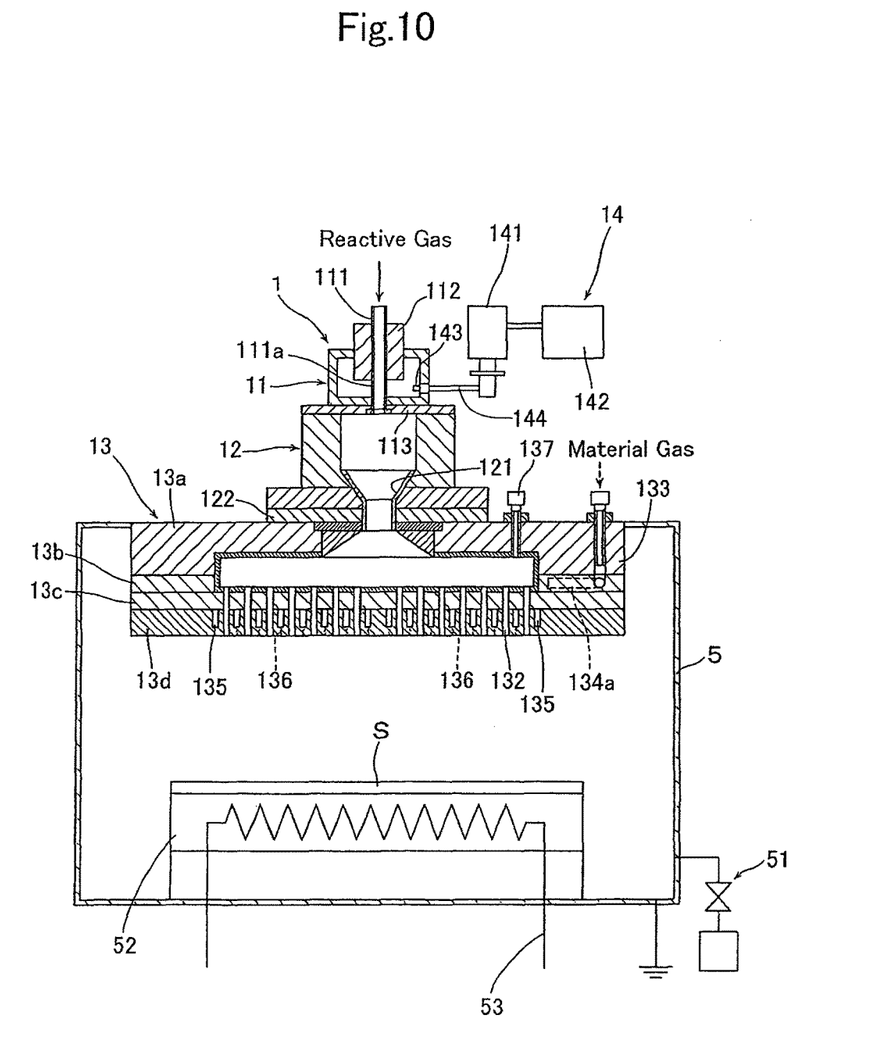
FIG. 10 is a cross-sectional schematic diagram showing the film-forming apparatus according to this invention.

With reference to FIG. 10, a description will now be made of the film-forming apparatus in which the above-described first shower head structure 1 (FIG. 1) is employed.

The film forming apparatus is made up of a film-forming chamber 5; and a shower head structure 1 which is disposed on the ceiling portion of the film-forming chamber 5. The film-forming chamber 5 is provided at a lower portion thereof with an exhaust means 51. It is thus possible to appropriately exhaust the material gas and the reactive gas introduced from the ceiling portion to thereby set the film-forming chamber to a predetermined degree of vacuum. At a position lying opposite to the shower head structure 1 of the film-forming chamber 5, a substrate mounting part 52 is disposed. This substrate mounting part 52 is provided with a heating means 53. It is thus possible to heat the substrate S mounted on the substrate mounting part 52 to a predetermined temperature, e.g., to above $300°$ C. when the CVD method is carried out and below $300°$ C. when the ALD method is carried out.

The constitution of this kind of film-forming apparatus is the same even in case the second or the third shower head structures 2, 3 (FIGS. 4 and 7) is employed in place of the first shower head structure 1.

The film-forming apparatus provided with any one of the above-described shower head structures 1, 2, 3 can also carry out the film-forming method using two kinds or more gases of the material gas and the reactive gas. As the film-forming method, there can be listed, e.g., the CVD method and the ALD method.

In order to carry out the CVD method by using the film-forming apparatus of this invention, a substrate S is mounted on the substrate mounting part 52 in a film-forming apparatus provided with the shower head structure 1 or 2. After heating by the heating means 53 such that the substrate temperature is below 180° C.~260° C., $N_2$ gas is introduced as the reactive gas from the nonmetallic pipe 111 (or double pipe 22) under conditions of 10~5000 sccm and, at the same time, Ar gas as the bubbling gas is introduced at 1000 sccm into $Zr(BH_4)_4$ inside the material tank. The material gas containing $Zr(BH_4)_4$ as obtained by bubbling is introduced from the material gas introduction pipe 133. At the same time, charging power is set by the microwave supplying means 14 to 0.1~5 kW to excite the reactive gas by oscillating microwaves and carry out the film forming for 5~180 seconds. A desired ZrBN film is then formed.

In a film-forming apparatus provided with a shower head structure 3, e.g., a substrate S is mounted on the substrate mounting part. After heating such that the substrate temperature becomes 400° C. and heating the wire 33 to 1500~2000° C., $N_2$ gas is introduced as the reactive gas in 10~5000 sccm, and Ar gas as the bubbling gas is introduced at 1000 sccm into $Zr(BH_4)_4$ inside the material tank. The material gas containing $Zr(BH_4)_4$ as obtained by the bubbling is introduced from the material gas introduction pipe 133, and film forming is carried out for 5~180 seconds while exciting the reactive gas by the wire 33. A desired ZrBN film is thus formed.

In case the ALD method is carried out, e.g., in a film-forming apparatus provided with the shower head structure 1 or 2, a substrate S is placed on a substrate mounting part. After heating such that the substrate temperature becomes 150° C., $H_2$ gas is introduced as the reactive gas in an amount of 1~100 sccm and also Ar gas is introduced as a bubbling gas in an amount of 1000 sccm into $Zr(BH_4)_4$ inside the material tank. The material gas containing $Zr(BH_4)_4$ as obtained by bubbling is introduced from the material gas introduction pipe 133 (adsorption step). After the lapse of a predetermined period of time, the supply of the raw gas is stopped, and the flow rate of the reactive gas is increased to 10~500 sccm. At the same time, charging power is set to 0.1~5 kW to excite the reactive gas by oscillating microwaves (modification step) and repeated these steps several times~several hundred times, thereby obtaining a $ZrB_2$ film of the desired thickness.

[Industrial Applicability]

According to this invention, when the CVD method or the ALD method is carried out, a film of uniform film thickness can be formed. Therefore, this invention can be utilized in a semiconductor technology.

BRIEF DESCRIPTION OF THE DRAWINGS

FIGS. 2(*a*), 2(*b*), and 2(*c*) are horizontal cross-sectional views of a ring-like member 13*b*, a first shower plate 13*c*, and a second shower plate 13*d*, respectively.

FIGS. 6(*a*) through 6(*c*) are schematic cross-sectional views explaining a double pipe 22, wherein: FIG. 6(*a*) is a vertical cross-sectional view of the double pipe 22; FIG. 6(*b*) is a cross-sectional view taken along line A-A' of FIG. 6(*a*); and FIG. 6(*c*) is a cross-sectional view taken along line B-B' of FIG. 6(*b*).

FIGS. 8(*a*) and (*b*) are schematic arrangement drawings explaining an example of material gas generation and another example, respectively.

DESCRIPTION OF REFERENCE NUMERALS

1 . . . first shower head structure
2 . . . second shower head structure
3 . . . third shower head structure
11 . . . coaxial resonant cavity
12 . . . gas introduction chamber
13 . . . shower head unit
13*a* . . . disc-like member
13*b* . . . ring-like member
13*c* . . . shower plate
13*d* . . . shower plate
14 . . . microwave supply means
15 . . . material gas introduction apparatus
31 . . . catalyst chamber
32 . . . reactive gas introduction pipe
33 . . . wire
151 . . . tank
152 . . . screen
152*a*, 152*b* . . . screen
153 . . . material
154 . . . mass flow controller
111 . . . nonmetallic pipe
111*a* . . . exposed portion
112 . . . upper conductor
113 . . . lower conductor
122 . . . ceramic flange
123, 124 . . . fixing member
131 . . . reactive gas diffusion chamber
132 . . . reactive gas ejection hole
133 . . . material gas introduction pipe
134 . . . gas passage
134*a* . . . gas passage
134*b* . . . gas passage
134*c* . . . connection hole
134*d* . . . connection hole
135 . . . material gas diffusion chamber
136 . . . material gas ejection hole
137 . . . gas introduction inlet
141 . . . magnetron
142 . . . microwave power source
143 . . . antenna
144 . . . coaxial cable
211 . . . gas source
212 . . . gas pipe
213 . . . valve
221 . . . sidewall
222 . . . cooling fluid passage
222*a* . . . upstream portion
222*b* . . . downstream portion
223 . . . fluid inlet
224 . . . fluid outlet
225 . . . plate
226 . . . opening
227 . . . gas passage

What is claimed is:

1. A film-forming apparatus comprising a film-forming chamber and a shower head unit, the shower head unit having:
   a square material gas diffusion chamber having four corners; and
   a reactive gas diffusion chamber,
   wherein
   a gas passage connecting the square material gas diffusion chamber and a material gas introduction pipe together is constituted into two stages, a first stage having a number of first-stage gas passages and a second stage having a number of second-stage gas passages, the number of gas passages in each stage being represented by $2^{n-1}$ (where n represents the number of the stage),
   the material gas introduction pipe is connected to a center of a first-stage gas passage,
   the first-stage gas passage communicates with the second-stage gas passages by connection holes that are provided on both ends of the first-stage gas passage and are connected to a center of each of the second-stage gas passages, and
   each of the second-stage gas passages is connected to the four corners of the square material gas diffusion chamber by connection holes formed on both ends of each of the second-stage gas passages.

2. The film-forming apparatus according to claim 1, wherein
   the material gas diffusion chamber is disposed at a bottom of the reactive gas diffusion chamber,
   the material gas introduction pipe is disposed on a wall surface of the reactive gas diffusion chamber, and
   each of the gas passages formed in each of the stages is formed in a circular arc-shape.

3. The film-forming apparatus according to claim 1, further comprising:
   a plasma generating means disposed on an upstream side of the shower head unit, the plasma generating means including:
   a coaxial resonant cavity provided with conducting bodies disposed at a distance from each other in an upper portion and a lower portion of an outer circumference of a non-metallic pipe for introducing the reactive gas; and
   a microwave supply circuit in which a height inside the coaxial resonant cavity is an integer time of ½ of an exciting wavelength, in which the gas injected from one end of the nonmetallic pipe is excited by microwaves in a region not provided with the nonmetallic pipe so as to be discharged, after conversion to plasma, out of the other end of the nonmetallic pipe, and in which the gas converted to plasma by the plasma generating means is introduced into the reactive gas diffusion chamber.

4. The film-forming apparatus according to claim 3, further comprising a cooling means disposed in the coaxial resonant cavity so as to introduce a cooling gas into the cavity, thereby cooling that portion of the nonmetallic pipe which is not provided with a conductor.

5. The film-forming apparatus according to claim 3, wherein the nonmetallic pipe is double-walled, and the cooling fluid is circulated in the clearance between the double walls.

6. The film-forming apparatus according to claim 1, further comprising a catalyst chamber in an upstream portion of the shower head unit, the catalyst chamber having a reactive gas introduction pipe, a metallic wire, and a heating means for heating the metallic wire, the catalyst chamber being so constructed and arranged that the gas introduced by the reactive gas introduction pipe is excited by the heated metallic wire and that the excited gas is introduced into the reactive gas diffusion chamber.

* * * * *